United States Patent
Wang et al.

(10) Patent No.: US 11,289,513 B2
(45) Date of Patent: Mar. 29, 2022

(54) THIN FILM TRANSISTOR AND METHOD FOR FABRICATING THE SAME, ARRAY SUBSTRATE AND DISPLAY DEVICE

(71) Applicant: BOE TECHNOLOGY GROUP CO., LTD., Beijing (CN)

(72) Inventors: Ke Wang, Beijing (CN); Hehe Hu, Beijing (CN); Xinhong Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 832 days.

(21) Appl. No.: 16/074,282

(22) PCT Filed: Jan. 19, 2018

(86) PCT No.: PCT/CN2018/073422
§ 371 (c)(1),
(2) Date: Jul. 31, 2018

(87) PCT Pub. No.: WO2019/007035
PCT Pub. Date: Jan. 10, 2019

(65) Prior Publication Data
US 2021/0210516 A1 Jul. 8, 2021

(30) Foreign Application Priority Data
Jul. 4, 2017 (CN) .......................... 201710536682.1

(51) Int. Cl.
*H01L 27/12* (2006.01)
(52) U.S. Cl.
CPC ...... *H01L 27/1222* (2013.01); *H01L 27/1262* (2013.01); *H01L 27/1288* (2013.01)
(58) Field of Classification Search
CPC ............. H01L 27/1222; H01L 27/1262; H01L 27/1288
(Continued)

(56) References Cited

U.S. PATENT DOCUMENTS

2010/0038641 A1* 2/2010 Imai .................... H01L 29/7869
257/57
2010/0304528 A1* 12/2010 Kim .................. H01L 21/02565
438/104
(Continued)

FOREIGN PATENT DOCUMENTS

CN 104392928 A 3/2015
CN 104900706 A 9/2015
(Continued)

OTHER PUBLICATIONS

International Search Report dated Mar. 27, 2018 corresponding to application No. PCT/CN2018/073422.
(Continued)

*Primary Examiner* — Igwe U Anya
(74) *Attorney, Agent, or Firm* — Nath, Goldberg & Meyer; Joshua B. Goldberg

(57) ABSTRACT

A thin film transistor and a method for fabricating the same, an array substrate and a display device are provided. The thin film transistor includes an active layer and a protective layer being provided on and in direct contact with the active layer, the protective layer is provided corresponding to a channel region of the thin film transistor; the protective layer is made of an oxygen-enriched metallic oxide insulation material which will not introduce any new element into the active layer. In the thin film transistor and the method for fabricating the same, the array substrate and the display device provided by the present disclosure, the active layer can be protected from being damaged by the etchant for forming the source/drain, and no new element will be introduced into the active layer; thus the characteristics and the stability of the thin film transistor is improved.

15 Claims, 3 Drawing Sheets

(58) Field of Classification Search
USPC .......................................................... 257/79
See application file for complete search history.

(56) References Cited

U.S. PATENT DOCUMENTS

2015/0162489 A1* 6/2015 Kao ................... H01L 21/8254
   257/43
2015/0255278 A1   9/2015 Ahn et al.
2015/0311345 A1* 10/2015 Zhao ................ H01L 29/66969
   257/43

FOREIGN PATENT DOCUMENTS

CN      104952935 A    9/2015
CN      107195688 A    9/2017

OTHER PUBLICATIONS

First Office Action dated May 11, 2018 corresponding to Chinese application No. 201710536682.1.

* cited by examiner

THIN FILM TRANSISTOR AND METHOD FOR FABRICATING THE SAME, ARRAY SUBSTRATE AND DISPLAY DEVICE

CROSS-REFERENCE TO RELATED APPLICATION

This is a National Phase Application filed under 35 U.S.C. 371 as a national stage of PCT/CN2018/073422, filed Jan. 19, 2018, an application claiming the benefit of Chinese Application No. 201710536682.1 filed Jul. 4, 2017, the content of each of which is hereby incorporated by reference in its entirety.

TECHNICAL FIELD

The present disclosure relates to the field of display technology, in particular, to a thin film transistor and a method for fabricating the same, an array substrate and a display device.

BACKGROUND

Thin film transistor (TFT) is a pixel-driving element for active matrix liquid crystal display (AMLCD) and active matrix organic light-emitting diode (AMOLED) display, which plays an important role in achieving a large-size, high-resolution and high-frame rate display. Currently, the material of the active layer in TFT mainly includes hydrogenated amorphous silicon, low temperature polysilicon, organic semiconductor and oxide semiconductor. Oxide semiconductor has high electron mobility and better homogeniety, and is applicable for driving AMLCD and AMOLED. To achieve a high-resolution display, "miniaturization" of the dimension of a TFT device is required. A back channel etching (BCE) structure is the key to achieve "miniaturization" of the dimension of a TFT device.

SUMMARY

The present disclosure provides a thin film transistor which includes an active layer. The thin film transistor further includes a protective layer being provided on and in direct contact with the active layer, and the protective layer is provided corresponding to a channel region of the thin film transistor;

the protective layer is made of an oxygen-enriched metallic oxide insulation material, which will not introduce any new element into the active layer.

In one implementation, the active layer is made of an oxide semiconductor material.

In one implementation, the oxide semiconductor material includes IGZO, ITZO, or IGZTO.

In one implementation, the oxygen-enriched metallic oxide insulation material includes $Zn_xO_y$, and y/x is larger than 1.

In one implementation, the oxygen-enriched metallic oxide insulation material includes $Sn_xO_y$, wherein y/x is larger than 2; or, the oxygen-enriched metallic oxide insulation material includes $Ga_xO_y$, wherein y/x is larger than 3/2; or, the oxygen-enriched metallic oxide insulation material includes $In_xO_y$, wherein y/x is larger than 2.

In one implementation, a thickness of the protective layer is in a range from 5 to 10 nm.

In one implementation, the active layer is provided corresponding to the channel region of the thin film transistor and ohmic contact regions located at two sides of the channel region.

In one implementation, the thin film transistor further includes a base substrate, a gate layer, a gate insulation layer, a source and a drain which are provided sequentially, wherein, the active layer is arranged on the gate insulation layer; and the source and the drain each include a main body provided on the gate insulation layer and a first step portion provided on a portion of the active layer corresponding to one ohmic contact region, the first step portion and the main body being connected as a whole.

In one implementation, the source and the drain each further include a second step portion provided on a portion of the protective layer, the second step portion and the first step portion being connected as a whole.

In some other implementations, the present disclosure further provides a method for fabricating a thin film transistor which includes:

forming an active layer; and forming a protective layer on the active layer such that the protective layer is in direct contact with the active layer and provided corresponding to a channel region of the thin film transistor, the protective layer is made of an oxygen-enriched metallic oxide insulation material, which will not introduce any new element into the active layer.

In one implementation, the steps of forming the active layer and forming the protective layer on the active layer further include:

depositing a whole layer of active film;

depositing a whole layer of protective film on the whole layer of active film; and performing a patterning process on the whole layer of active film and the whole layer of protective film to form the active layer and the protective layer such that the active layer is provided corresponding to the channel region of the thin film transistor and ohmic contact regions located at two sides of the channel region and the protective layer is provided corresponding to the channel region of the thin film transistor.

In one implementation, the step of performing the patterning processing on the whole layer of active film and the whole layer of protective film includes a step in which the whole layer of active film and the whole layer of protective film are patterned simultaneously by a single patterning process.

In one implementation, the step in which the whole layer of active film and the whole layer of protective film are patterned simultaneously by a single patterning process includes the following steps:

coating a photoresist layer on the whole layer of protective film, and exposing the photoresist layer using a multi-grayscale mask to form a photoresist pattern on the whole layer of protective film, the photoresist pattern including a photoresist-fully-retained region, photoresist-partially-retained regions and a photoresist-removed region, wherein the photoresist-fully-retained region corresponds to the channel region of the thin film transistor, the photoresist-partially-retained regions correspond to the ohmic contact regions of the thin film transistor, and the photoresist-removed region corresponds to regions of the thin film transistor other than the ohmic contact regions and the channel region;

removing portions of the whole layer of active film and the whole layer of protective film corresponding to the photoresist-removed region;

performing an ashing process on the photoresist pattern to remove the photoresist in the photoresist-partially-retained regions and to thin a thickness of the photoresist in the photoresist-fully-retained region; and removing portions of a remaining protective film corresponding to the photoresist-partially-retained regions.

In one implementation, the step of removing portions of the whole layer of active film and the whole layer of protective film corresponding to the photoresist-removed region includes: removing portions of the whole layer of active film and the whole layer of protective film corresponding to the photoresist-removed region by a wet etching method.

In one implementation, the step of removing portions of the whole layer of active film and the whole layer of protective film corresponding to the photoresist-removed region includes: removing portions of the whole layer of active film and the whole layer of protective film corresponding to the photoresist-removed region by a dry etching method;

the step of removing portions of a remaining protective film corresponding to the photoresist-partially-retained regions includes: removing portions of the remaining protective film corresponding to the photoresist-partially-retained regions by a dry etching method.

In one implementation, the step of depositing the whole layer of protective film on the whole layer of active film further includes the following steps:

depositing the whole layer of protective film on the whole layer of active film; and performing an annealing process on the whole layer of protective film.

In one implementation, the annealing process is performed at a temperature in a range from 400° C. to 2300° C.

In one implementation, the whole layer of protective film is deposited by a magnetron sputtering method.

In some other implementations, the present disclosure further provides an array substrate which includes the above thin film transistor provided by the present disclosure.

In some other implementations, the present disclosure further provides a display device which includes the above array substrate provided by the present disclosure.

DETAILED DESCRIPTION

The thin film transistor and the method for fabricating the same, the array substrate and the display device provided by the present disclosure will be described in detail below in conjunction with the drawings in order that a person skilled in the art can understand the technical solutions of the present disclosure better.

Figure 1:
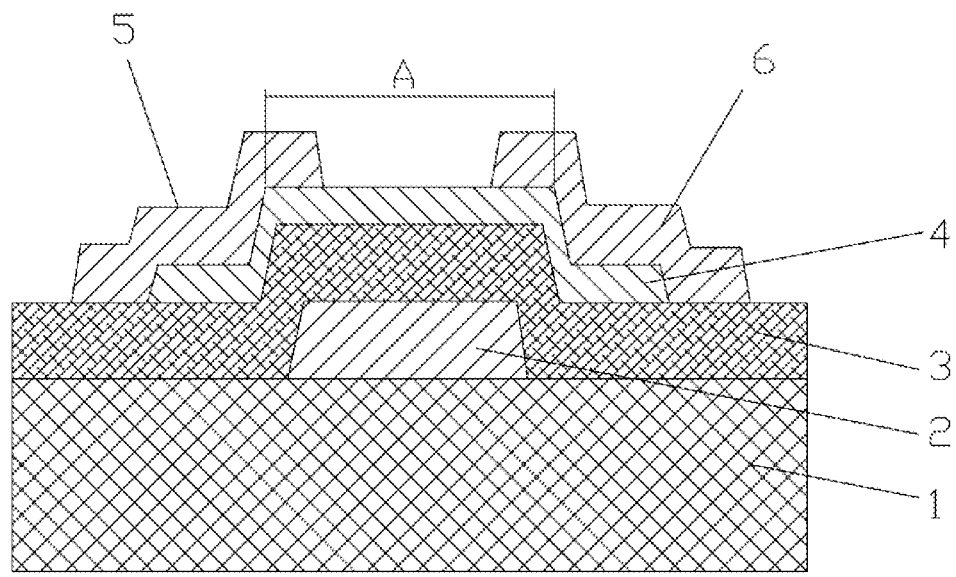
FIG. 1 is a schematic diagram of a structure of a thin film transistor in the prior art.

FIG. 1 is a structural diagram of an existing thin film transistor. Referring to FIG. 1, the thin film transistor includes a base substrate 1, a gate layer 2, a gate insulation layer 3, an active layer 4, a source 5 and a drain 6 which are provided sequentially. This thin film transistor is of a back channel etching structure in which the source 5 and the drain 6 are in contact with the active layer 4 directly in the channel region A. Based on our findings, when an etching process of patterning the source/drain film is performed so as to form the source 5 and the drain 6, a portion of the active layer 4 in the channel region may be damaged by the etchant for forming the source 5 and the drain 6, and thereby the characteristics of the TFT device (e.g., the reliability and the stability of threshold voltage) become worse.

In a thin film transistor in the prior art, an etching stopping layer is provided in a region on the active layer corresponding to the channel region so as to prevent the portion of the active layer in the channel region from being damaged by the etchant for forming the source/drain. However, a research of the inventor found that the material of the etching stopping layer is an oxygen-enriched material such as $SiO_2$, $Al_2O_3$ and the like, and such an oxygen-enriched material has the following problems in practical applications:

the material of the active layer is generally IGZO, ITZO or IGZTO, which are crystals combined by four metallic oxides of $Sn_xO_y$, $Ga_xO_y$, $In_xO_y$ and $Zn_xO_y$, and thus contain elements of Sn, Ga, In and Zn in themselves. In this case, if the material of the etching stopping layer is $SiO_2$ or $Al_2O_3$, new elements may be introduced into the active layer, i.e., Al, Si and the like may diffuse into the active layer, affecting the stability of the thin film transistor.

Moreover, the etching stopping layer made of $SiO_2$ or $Al_2O_3$ is required to be fabricated by a chemical vapor deposition (PECVD) process, and it is required for the PECVD to use a gas such as $SiH_4$ as a reactive gas. Since $SiH_4$ contains more hydrogen element which may damage the oxide semiconductor material such as IGZO, the characteristics and stability of the thin film transistor may be affected seriously, and the oxide semiconductor material may even become conductor, causing the switching characteristic of the thin film transistor invalid.

Figure 2:
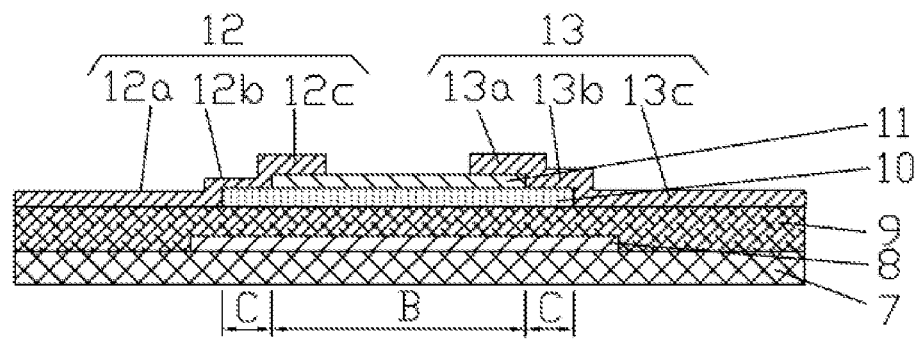
FIG. 2 is a schematic diagram of a structure of a thin film transistor provided by an embodiment of the present disclosure.

FIG. 2 is a schematic diagram of a structure of a thin film transistor provided by an embodiment of the present disclosure. Referring to FIG. 2, the thin film transistor includes a base substrate 7, a gate layer 8, a gate insulation layer 9, an active layer 10, a protective layer 11, a source 12 and a drain 13 which are provided sequentially, wherein the protective layer 11 is provided in correspondence to a channel region B of the thin film transistor and is in direct contact with the active layer, and thereby it can protect the active layer 10 from being damaged by the etchant for forming the source 12 and the drain 13 in the etching process for patterning the source film and the drain film to form the source 12 and the drain 13.

Moreover, the above protective layer 11 is formed using an oxygen-enriched metallic oxide insulation material. The so-called oxygen-enriched metallic oxide insulation material refers to a material that the oxygen content in the metallic oxide material is higher than the oxygen content in the most stable structure of the metallic oxide. For example, the most stable structure of $Sn_xO_y$ is $SnO_2$, and in an oxygen-enriched $Sn_xO_y$, the ratio of y to x is larger than 2. The above protective layer 11 formed using an oxygen-enriched metallic oxide insulation material may have the following advantages:

Firstly, the oxygen-enriched metallic oxide insulation material may reduce excessive charges captured at an interface between the gate insulation layer and the oxide semiconductor (i.e., the active layer) during the working of the oxide semiconductor, and thereby may improve the stability and the reliability of the TFT device;

Secondly, the oxygen-enriched metallic oxide insulation material has excellent corrosion resistance, and thus can effectively protect the active layer from being etched and improve the reliability of the TFT device.

Meanwhile, the above oxygen-enriched metallic oxide insulation material may not introduce any new element into the active layer 10, and thus may improve the characteristics and the stability of the thin film transistor.

In the present embodiment, the material of the active layer 10 is an oxide semiconductor. Specifically, the material of the oxide semiconductor may include IGZO, ITZO or IGZTO, which are crystals combined by four metallic oxides of $Sn_xO_y$, $Ga_xO_y$, $In_xO_y$, and $Zn_xO_y$, and thus contain elements of Sn, Ga, In and Zn in themselves. In this case, the oxygen-enriched metallic oxide insulation material may include $Zn_xO_y$; such material does not introduce any new element and thus the stability of the oxide semiconductor material can be maintained. Furthermore, $Zn_xO_y$ has high corrosion resistance and may enhance the protective effect on the active layer. Meanwhile, in $Zn_xO_y$, the ratio of y to x (y/x) is larger than 1, i.e., it is an oxygen-enriched material.

Similar to the above material, the oxygen-enriched metallic oxide insulation material may include $Sn_xO_y$; wherein y/x is larger than 2, i.e., it is an oxygen-enriched material. Alternatively, the oxygen-enriched metallic oxide insulation material may include $Ga_xO_y$; wherein y/x is larger than 3/2, i.e., it is an oxygen-enriched material. Alternatively, the oxygen-enriched metallic oxide insulation material may include $In_xO_y$; wherein y/x is larger than 2, i.e., it is an oxygen-enriched material.

The oxygen-enriched metallic oxide insulation material such as $Zn_xO_y$, $Sn_xO_y$, $Ga_xO_y$, and $In_xO_y$ as mentioned above may be deposited by a magnetron sputtering method. The magnetron sputtering deposition method is a physical deposition method which will not destroy the oxide semiconductor material, and thus it may ensure better characteristics and stability of the thin film transistor, prevent the oxide semiconductor material from becoming conductor and thus prevent the switching characteristic of the thin film transistor from being invalid. Moreover, the element ratio in the above oxygen-enriched metallic oxide insulation material can be controlled with ease, and the values of x and y may be selected flexibly as needed to ensure more stable characteristics. In addition, the elements contained in the above oxygen-enriched metallic oxide insulation material and the material of the active layer are elements in a same group or are the same elements. When the oxygen-enriched metallic oxide insulation material is used to form the protective layer, the contact resistance between the protective layer and the active layer may be reduced, improving the device performance.

The present disclosure has the following beneficial effects:

in the technical solutions of the thin film transistor and the method for fabricating the same, the array and the display device provided by the present disclosure, since a protective layer is provided on and is in direct contact with the active layer and the protective layer is provided in correspondence to the channel region of the thin film transistor, the active layer can be protected from being damaged by the etchant for forming the source and the drain during the etching process in which the source film and the drain film are patterned to form the source and the drain. Meanwhile, the protective layer is formed using an oxygen-enriched metallic oxide insulation material, elements of which are selected from two or more elements of the active layer; thus, so that the characteristics and the stability of the thin film transistor can be improved.

In practical applications, the thickness of the above protective layer 11 is 5 to 10 nm. The thickness in this range can protect the active layer 10 without making the etching process more difficult.

In the present embodiment, the active layer 10 is provided in correspondence to the channel region B of the thin film transistor and the ohmic contact regions C at two sides of the channel region B. Further, the source 12 includes a main body 12a provided on the gate insulation layer 9 and a first step portion 12b provided on a portion of the active layer 10 corresponding to the ohmic contact region C, the first step portion 12b and the main body 12a being connected as a whole. The first step portion 12b of the source 12 and the portion of the active layer 10 corresponding to the ohmic contact region C are in an ohmic contact, which can improve the device performance. Similarly, the drain 13 includes a main body 13a provided on the gate insulation layer 9 and a first step portion 13b provided on a portion of the active layer 10 corresponding to the ohmic contact region C, the first step portion 13 and the main body 13a being connected as a whole. The first step portion 13b of the drain 13 and the portion of the active layer 10 corresponding to the ohmic contact region C are in an ohmic contact.

In addition, in the present embodiment, the source 12 further includes a second step portion 12c provided on a portion of the protective layer 11, the second step portion 12c and the first step portion 12b being connected as a whole. The drain 13 further includes a second step portion 13c provided on a portion of the protective layer 11, the second step portion 13c and the first step portion 13b being connected as a whole. Obviously, in practical applications, the source 12 and the drain 13 may not include the second step portions.

It should be noted that, in the present embodiment, the thin film transistor includes the base substrate 7, the gate layer 8, the gate insulation layer 9, the active layer 10, the protective layer 11, the source 12 and the drain 13 provided in sequence. However, the present disclosure is not limited thereto. In practical application, a functional layer(s) may be added into or removed from the thin film transistor as needed.

As another technical solution, an embodiment of the present disclosure further provides a method for fabricating a thin film transistor. As described in conjunction with FIG. 2, the method includes the following steps S101 to S103.

Figure 3A:
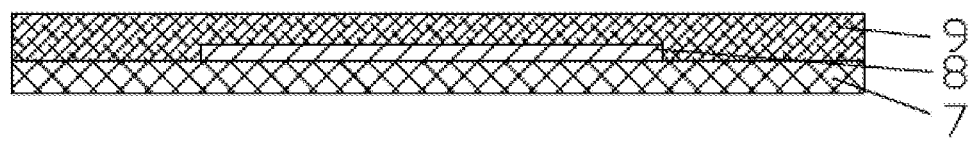
FIG. 3A is a diagram of one procedure in a method for fabricating a thin film transistor provided by an embodiment of the present disclosure.

S101, providing a base substrate 7 on which a gate layer 8 and a gate insulation layer 9 are formed sequentially, as shown in FIG. 3A;

S102, forming an active layer 10 on the gate insulation layer 9;

S103, forming a protective layer 11 on the active layer 10.

The protective layer 11 is in direct contact with the active layer 10, and is provided in correspondence to the channel region B of the thin film transistor. The protective layer 11 is formed using an oxygen-enriched metallic oxide insulation material, which will not introduce any new element into the active layer 10. Since the description of the oxygen-enriched metallic oxide insulation material has been made in detail in the above embodiments, it will not be repeated here.

The above protective layer 11 can protect the active layer 10 from being damaged by the etchant for forming the source 12 and the drain 13 without introducing any new element into the active layer 10, and thus the characteristics and the stability of the thin film transistor can be improved.

The step S102 of forming the active layer 10 and the step S103 for forming the protective layer 11 on the active layer 10 as mentioned above further include the following steps S201 to S203.

Figure 3B:
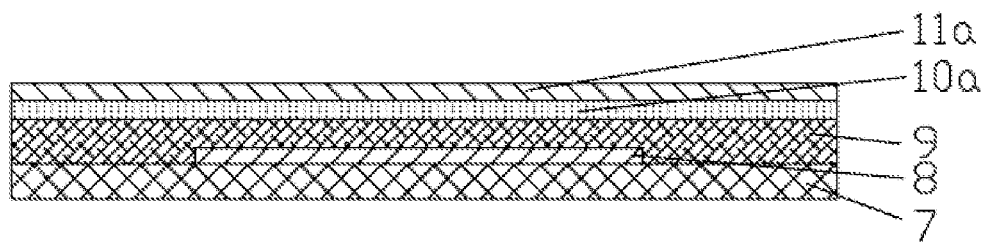
FIG. 3B is a diagram of another procedure in the method for fabricating a thin film transistor provided by an embodiment of the present disclosure.
Figure 3C:
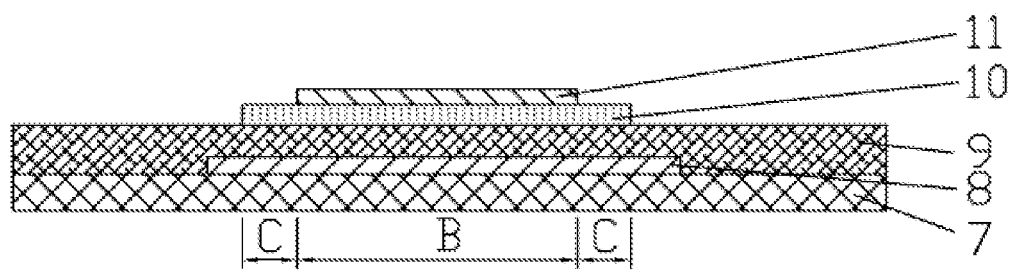
FIG. 3C is a diagram of still another procedure in the method for fabricating a thin film transistor provided by an embodiment of the present disclosure.

S201, as shown in FIG. 3B, depositing a whole layer of active film 10a;

S202, as shown in FIG. 3B, depositing a whole layer of protective film 11a on the whole layer of active film 10a;

S203, as shown in FIG. 3C, performing a patterning process on the whole layer of active film 10a and the whole layer of protective film 11a to form the active layer 10 and the protective layer 11, so that the active layer 10 is provided in correspondence to the channel region B of the thin film transistor and ohmic contact regions C located at two sides of the channel region B, and the protective layer 11 is provided in correspondence to the channel region B of the thin film transistor.

In an implementation, in the above step S203, performing the patterning process on the whole layer of active film 10a and the whole layer of protective film 11a by a single patterning process simultaneously, which can reduce the number of process steps and the process costs. The single patterning process may employ the following method. Specifically, the above step S203 further includes steps S2031 to S2034 as below.

Figure 4A:
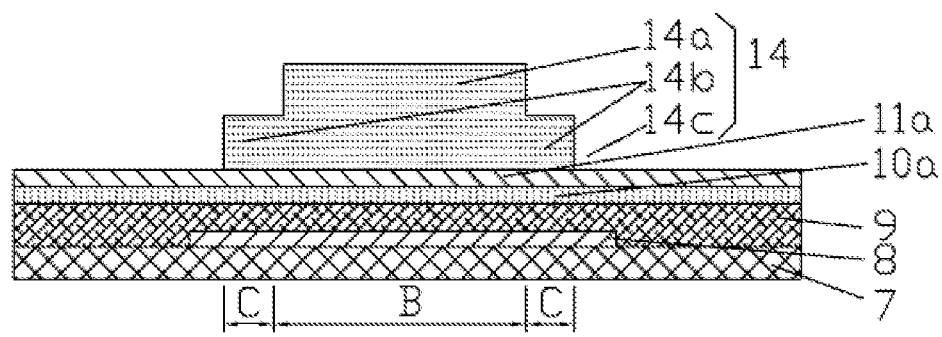
FIG. 4A is a diagram of one procedure in a single patterning process employed in an embodiment of the present disclosure.

S2031, as shown in FIG. 4A, coating a photoresist layer on the whole layer of protective film 11a, and exposing the photoresist layer using a multi-grayscale mask to form a photoresist pattern 14 on the whole layer of protective film 11a, the photoresist pattern 14 including a photoresist-fully-retained region 14a, a photoresist-partially-retained region 14b and a photoresist-removed region 14c, wherein the photoresist-fully-retained region 14a corresponds to the channel region B of the thin film transistor, the photoresist-partially-retained regions 14b correspond to the ohmic contact regions C of the thin film transistor, and the photoresist-removed region 14c corresponds to other region of the thin film transistor than the ohmic contact regions C and the channel region B.

Figure 4B:
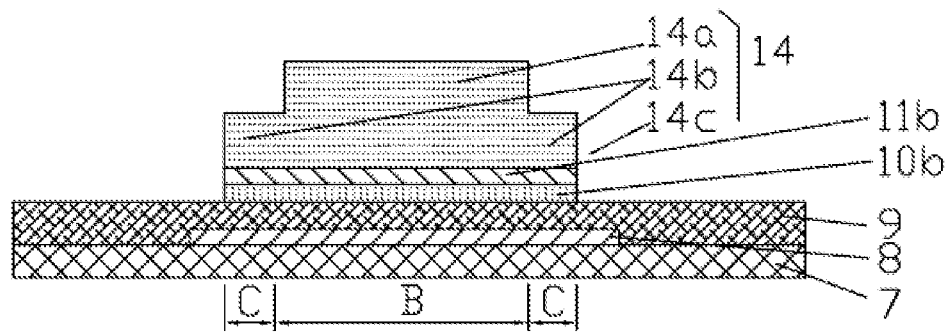
FIG. 4B is a diagram of another procedure in a single patterning process employed in an embodiment of the present disclosure.
Figure 4C:
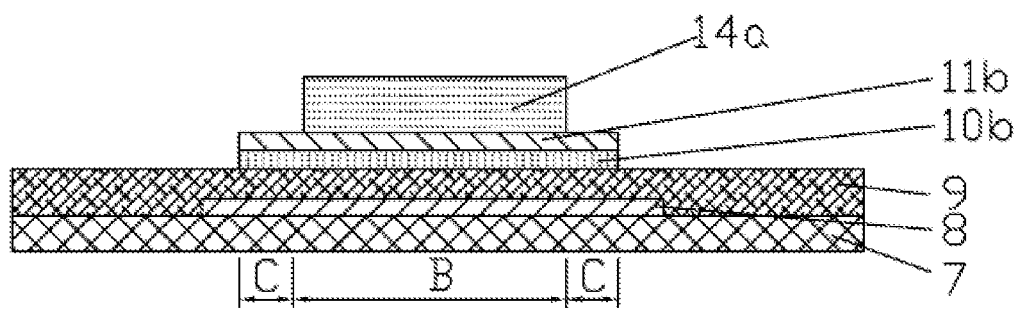
FIG. 4C is a diagram of still another procedure in a single patterning process employed in an embodiment of the present disclosure.

S2032, as shown in FIG. 4B, removing portions of the whole layer of active film 10a and the whole layer of protective film 11a corresponding to the photoresist-removed region 14c;

S2033, as shown in FIG. 4C, performing an ashing process on the photoresist pattern 14 to remove the photoresist in the photoresist-partially-retained region 14b and to thin a thickness of the photoresist in the photoresist-fully-retained region 14a.

Figure 4D:
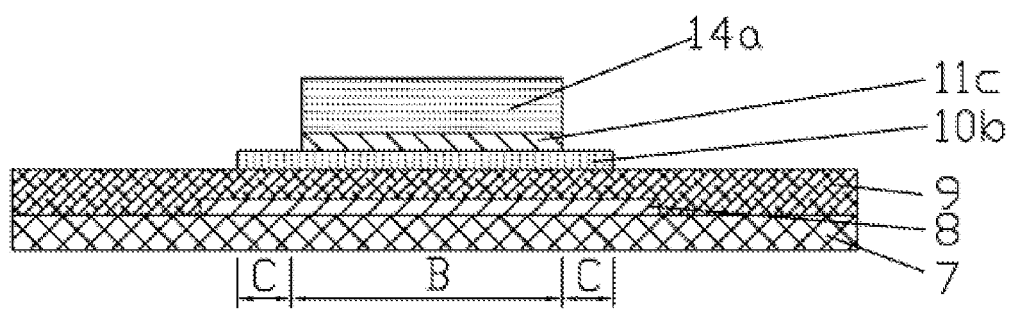
FIG. 4D is a diagram of still further another procedure in a single patterning process employed in an embodiment of the present disclosure.

S2034, as shown in FIG. 4D, removing portions of a remaining protective film corresponding to the photoresist-partially-retained regions 14b.

The above step S2032 may include: removing portions of the whole layer of active film 10a and the whole layer of protective film 11a corresponding to the photoresist-removed region 14c by a wet etching method.

The above step S2032 may include: removing portions of the whole layer of active film 10a and the whole layer of protective film 11a corresponding to the photoresist-removed region 14c by a dry etching method.

The above step S2034 may include: removing portions of the remaining protective film corresponding to the photoresist-partially-retained regions 14b by a dry etching method. Due to the dray etching effect, the resistance of the direct contact between the portions of the active layer 10 corresponding to the ohmic contact regions C and the source 12 and the drain 13 may be significantly decreased, and thus these portions are very suitable to be the ohmic contact regions.

The above step S103 further includes the following steps S1031 and S1032.

S1031, depositing the whole layer of protective film 11a on the whole layer of active film 10a; and S1032, performing an annealing process on the whole layer of protective film 11a.

By performing the annealing process on the whole layer of protective film 11a, the impurity content of the protective layer 11 may be decreased, which may further improve the reliability of the TFT device. The temperature of the above annealing process may be in a range from 400° C. to 2300° C.

In the above step S202, the whole layer of protective film 11a is deposited by a magnetron sputtering method. The magnetron sputtering deposition is a physical deposition method which will not damage the oxide semiconductor material, and thus it may ensure better characteristics and stability of the thin film transistor, prevent the oxide semiconductor material from becoming conductor and thus prevent the switching characteristic of the thin film transistor from being invalid.

As another technical solution, the present disclosure further provides an array substrate which includes the above thin film transistor provided by the present disclosure.

With the thin film transistor provided by the present disclosure, the performance and stability of the array substrate provided by the present disclosure may be improved.

As another technical solution, the present disclosure further provides a display device which includes the above array substrate provided by the present disclosure.

With the array substrate provided by the present disclosure, the performance and stability of the display device provided by the present disclosure may be improved.

In the technical solutions of the thin film transistor and the method for fabricating the same, the array and the display device provided by the present disclosure, since a protective layer is provided on and is in direct contact with the active layer, and the protective layer corresponds to the channel region of the thin film transistor, the active layer can be protected from being damaged by the etchant for forming the source and the drain during the etching process in which the source film and the drain film are patterned to form the source and the drain. Meanwhile, the protective layer is formed using an oxygen-enriched metallic oxide insulation material, and the oxygen-enriched metallic oxide insulation material may achieve the following advantages: no new element is introduced into the active layer; thus, the characteristics and the stability of the thin film transistor can be improved.

Obviously, the above implementations are exemplary implementations simply for illustrating the principle of the present disclosure. However, the present disclosure is not limited thereto. An ordinary person skilled in the art may make various modifications and variations without departing from the spirit and scope of the present disclosure. The present disclosure is intended to encompass these modifications and variations.

What is claimed is:

1. A thin film transistor, comprising an active layer, wherein the thin film transistor further comprises a protective layer being provided on and in direct contact with the active layer, and the protective layer is provided corresponding to a channel region of the thin film transistor; and
the protective layer is made of a metallic oxide insulation material, elements of which are selected from two or more elements of the active layer;
the metallic oxide insulation is selected from $Zn_xO_y$, $Sn_xO_y$, $Ga_xO_y$, and $In_xO_y$,
as for $Zn_xO_y$, y/x is larger than 1;
as for $Sn_xO_y$, y/x is larger than 2;
as for $Ga_xO_y$, y/x is larger than 3/2; and
as for $In_xO_y$, y/x is larger than 2.

2. The thin film transistor of claim 1, wherein the active layer is made of an oxide semiconductor material.

3. The thin film transistor of claim 2, wherein the oxide semiconductor material comprises IGZO, ITZO, or IGZTO.

4. The thin film transistor of claim 1, wherein the protective layer has a thickness in a range from 5 to 10 nm.

5. An array substrate, comprising the thin film transistor of claim 1.

6. A display device, comprising the array substrate of claim 5.

7. A method for fabricating a thin film transistor, comprising:
forming an active layer; and
forming a protective layer on the active layer such that the protective layer is in direct contact with the active layer and provided corresponding to a channel region of the thin film transistor, the protective layer is made of a metallic oxide insulation material, elements of which are selected from two or more elements of the active layer:
the metallic oxide insulation is selected from $Zn_xO_y$, $Sn_xO_y$, $Ga_xO_y$, and $In_xO_y$,
as for $Zn_xO_y$, y/x is larger than 1;
as for $Sn_xO_y$, y/x is larger than 2;
as for $Ga_xO_y$, y/x is larger than 3/2; and
as for $In_xO_y$, y/x is larger than 2.

8. The method for fabricating the thin film transistor of claim 7, wherein the steps of forming the active layer and forming the protective layer on the active layer further comprise:
depositing a whole layer of active film;
depositing a whole layer of protective film on the whole layer of active film; and
performing a patterning process on the whole layer of active film and the whole layer of protective film to form the active layer and the protective layer such that the active layer is provided corresponding to the channel region of the thin film transistor and ohmic contact regions located at two sides of the channel region and the protective layer is provided in corresponding to the channel region of the thin film transistor.

9. The method for fabricating the thin film transistor of claim 8, wherein the step of performing the patterning process on the whole layer of active film and the whole layer of protective film comprises a step in which the whole layer of active film and the whole layer of protective film are patterned simultaneously by a single patterning process.

10. The method for fabricating the thin film transistor of claim 9, wherein the step in which the whole layer of active film and the whole layer of protective film are patterned simultaneously by a single patterning process comprises steps of:
coating a photoresist layer on the whole layer of protective film, and exposing the photoresist layer using a multi-grayscale mask to form a photoresist pattern on the whole layer of protective film, the photoresist pattern comprising a photoresist-fully-retained region, photoresist-partially-retained regions and a photoresist-removed region, wherein the photoresist-fully-retained region corresponds to the channel region of the thin film transistor, the photoresist-partially-retained regions correspond to the ohmic contact regions of the thin film transistor, and the photoresist-removed region corresponds to regions of the thin film transistor other than the ohmic contact regions and the channel region;
removing portions of the whole layer of active film and the whole layer of protective film corresponding to the photoresist-removed region;
performing an ashing process on the photoresist pattern to remove the photoresist in the photoresist-partially-retained regions and to thin the photoresist in the photoresist-fully-retained region; and
removing portions of a remaining protective film corresponding to the photoresist-partially-retained regions.

11. The method for fabricating the thin film transistor of claim 10, wherein the step of removing portions of the whole layer of active film and the whole layer of protective film corresponding to the photoresist-removed region comprises: removing portions of the whole layer of active film and the whole layer of protective film corresponding to the photoresist-removed region by a wet etching method.

12. The method for fabricating the thin film transistor of claim 10, wherein the step of removing portions of the whole layer of active film and the whole layer of protective film corresponding to the photoresist-removed region includes: removing portions of the whole layer of active film and the whole layer of protective film corresponding to the photoresist-removed region by a dry etching method; and
the step of removing portions of the remaining protective film corresponding to the photoresist-partially-retained regions comprises: removing portions of the remaining protective film corresponding to the photoresist-partially-retained regions by a dry etching method.

13. The method for fabricating the thin film transistor of claim 8, wherein, the step of depositing the whole layer of protective film on the whole layer of active film comprises steps of:
depositing the whole layer of protective film on the whole layer of active film; and
performing an annealing process on the whole layer of protective film.

14. The method for fabricating the thin film transistor of claim 13, wherein the annealing process is performed at a temperature in a range from 400° C. to 2300° C.

15. The method for fabricating the thin film transistor of claim 8, wherein the whole layer of protective film is deposited by a magnetron sputtering method.

* * * * *